United States Patent [19]

Hayashi et al.

[11] Patent Number: 4,888,142

[45] Date of Patent: Dec. 19, 1989

[54] PROCESS FOR PRODUCING β-FORM $Si_3N_4$

[75] Inventors: Kenrou Hayashi; Reiji Oguma, both of Hadano; Masayuki Tamura, Chigasaki, all of Japan

[73] Assignee: Toshiba Ceramics Co., Ltd., Tokyo, Japan

[21] Appl. No.: 139,109

[22] Filed: Dec. 22, 1987

Related U.S. Application Data

[63] Continuation of Ser. No. 834,818, Feb. 28, 1986, abandoned.

[30] Foreign Application Priority Data

Apr. 11, 1985 [JP] Japan .................. 60-77157

[51] Int. Cl.⁴ .................. F27B 9/04; B29C 67/00
[52] U.S. Cl. .................. 264/65; 264/1; 423/344; 427/255.2; 427/377; 427/397.7
[58] Field of Search .................. 423/344, 406; 427/94, 427/397.7, 255.2, 95, 377; 264/81, 65

[56] References Cited

U.S. PATENT DOCUMENTS

| | | | |
|---|---|---|---|
| 3,175,918 | 3/1965 | McGahan et al. | 501/82 |
| 3,835,211 | 9/1974 | Coe et al. | 423/344 |
| 3,992,497 | 11/1976 | Terwilliger et al. | 423/344 |
| 4,073,845 | 2/1978 | Buljan et al. | 423/344 |
| 4,090,851 | 5/1978 | Berkman et al. | 427/94 |
| 4,101,616 | 7/1978 | Buljan | 264/65 |
| 4,254,161 | 3/1981 | Kemlage | 427/95 |
| 4,310,477 | 1/1982 | Uy et al. | 264/67 |
| 4,395,438 | 7/1983 | Chiang | 427/95 |
| 4,404,236 | 9/1983 | Komatsu et al. | 427/94 |
| 4,440,707 | 4/1984 | Shimamori et al. | 423/344 |
| 4,469,801 | 9/1984 | Hirai et al. | 501/96 |
| 4,500,483 | 2/1985 | Veltri et al. | 427/227 |
| 4,505,720 | 3/1985 | Gabor et al. | 427/217 |
| 4,624,737 | 11/1986 | Shimbo | 427/94 |
| 4,717,693 | 1/1988 | Wittmer | 423/344 |

FOREIGN PATENT DOCUMENTS

| | | |
|---|---|---|
| 0096638 | 7/1980 | Japan .................. 427/94 |
| 942082 | 11/1963 | United Kingdom . |
| 1092637 | 11/1967 | United Kingdom . |
| 1117788 | 6/1968 | United Kingdom . |
| 1340696 | 12/1973 | United Kingdom . |
| 1396916 | 6/1975 | United Kingdom . |
| 1602822 | 11/1981 | United Kingdom . |

OTHER PUBLICATIONS

"Densification of $Si_3N_4$ by High Pressure Hot-Pressing", Ceramic Bulletin, vol. 60 (1981), Dec., No. 12, pp. 1281–1283.

Primary Examiner—Robert L. Stoll
Assistant Examiner—Lori S. Freeman
Attorney, Agent, or Firm—Foley & Lardner, Schwartz, Jeffery, Schwaab, Mack, Blumenthal & Evans

[57] ABSTRACT

Disclosed is a process for producing β-form $Si_3N_4$ comprising firing amorphous or α-form $Si_3N_4$ of high chemical purity in a non-oxidizing atmosphere under an elevated pressure at a temperature of at least about 1600° C., as well as a process for producing an article comprising such β-form $Si_3N_4$.

18 Claims, 2 Drawing Sheets

PROCESS FOR PRODUCING β-FORM SI₃N₄

This application is a continuation, of application Ser. No. 834,818, filed Feb. 28, 1986, now abandoned.

BACKGROUND OF THE INVENTION

This invention concerns a process for producing β-form $Si_3N_3$ (hereinafter simply referred to as $\beta$-$Si_3N_4$) from amorphous or α-form $Si_3N_4$ (hereinafter simply referred to as α-$Si_3N_4$), as well as a process for producing a $Si_3N_4$ article containing $\beta$-$Si_3N_4$.

Amorphous $Si_3N_4$ and crystalline α- or $\beta$-$Si_3N_4$ are known. Among the three types of $Si_3N_4$, $\beta$-$Si_3N_4$ is considered to have the highest corrosion resistance against molten silicon or the like.

Conventionally in order to prepare $\beta$-$Si_3N_4$ amorphous or α-$Si_3N_4$ having low purity and containing metal oxides such as $Y_2O_3$ or metal nitrides such as TiN in amounts of about 5 to 20% by weight has been heat treated at a temperature from 1500 to 1700° C. Accordingly, $\beta$-$Si_3N_4$ produced by the conventional process contains a relatively large amount of impurities. Reaction sintered $Si_3N_4$ is also known as $\beta$-$Si_3N_4$ having a relatively high chemical purity, but the reaction sintered $Si_3N_4$ also contains not less than 0.5% by weight of impurities such as A1, C and O (in total), due to the impurities in the starting $Si_3N_4$ material or source $Si_3N_4$ material. On the other hand, the CVD (Chemical Vapor Deposition) process is also known as a process for producing $Si_3N_4$ having high purity. However, the $Si_3N_4$ having high purity produced up until now by the CVD process is amorphous or α-form $Si_3N_4$.

No process is yet known for changing the $Si_3N_4$ produced by the CVD process into β-form while keeping the purity of the $Si_3N_4$ high.

SUMMARY OF THE INVENTION

In view of the foregoing, an object of this invention is to provide a process for producing $\beta$-$Si_3N_4$ having high chemical purity.

Another object of this invention is to provide a process for producing an article containing $\beta$-$Si_3N_4$ and comprising $Si_3N_4$ having high chemical purity.

In accomplishing these objects, there has been provided according to one aspect of this invention, a process for producing $\beta$-$Si_3N_4$ comprising the step of firing $Si_3N_4$ having high chemical purity in a nonoxidizing atmosphere under an elevated pressure at a temperature of at least about 1600° C.

There has also been provided according to this invention a process for producing a $Si_3N_4$ article containing $\beta$-$Si_3N_4$, comprising the steps of providing an article comprising $Si_3N_4$ having high chemical purity and firing said article in a non-oxidizing atmosphere under an elevated pressure at a temperature of at least about 1600° C.

Further objects, features and advantages of this invention will become apparent from the description of preferred embodiments which follows when considered together with the attached figures of drawings.

DETAILED DESCRIPTION OF THE PREFERRED EMBODIMENTS

Figure 1:
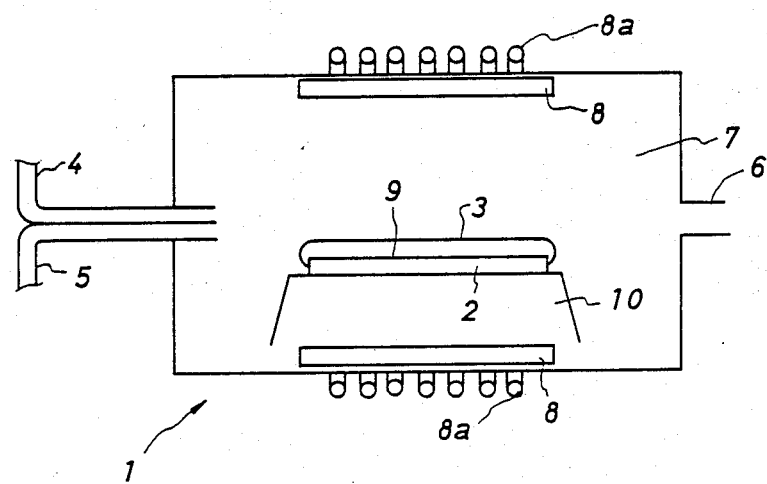
FIG. 1 is a schematic view of a furnace for producing amorphous or α-$Si_3N_4$ by the CVD process.

In a preferred embodiment for producing or synthesizing $\beta$-$Si_3N_4$ according to this invention, amorphous or α-$Si_3N_3$ having high chemical purity is prepared by the CVD process. In the case of preparing amorphous or α-$Si_3N_4$ by the CVD process, either the reduced pressure method or normal pressure method may be used. As the reaction gases, combinations of $SiCl_4$ and $NH_3$, $SiH_4$ and $NH_3$, $SiH_2Cl_2$ and $NH_3$, or any other desired combinations may be used, provided that they are highly chemically pure. The temperature in the reaction chamber is preferably about from 700 to 1300° C. but, if desired, it maybe lower than 700° C. or higher than 1300° C.

A substrate body or substrate base, on which amorphous or α-$Si_3N_4$ is deposited by the CVD process, is composed of graphite material or material containing graphite. Silicon, quartz glass, alumina, or the like may be used instead of graphite. The shape of the substrate body or the substrate base is chosen, for example, in view of the ease of the deposition of $Si_3N_4$ by the CVD process and, optionally, in view of the ease of removing the substrate body or the substrate base. The substrate body or the substrate base may be formed into such a shape that $Si_3N_4$ can be deposited to a shape that embodies the shape of an article.

According to this invention, the gas for the non-oxidizing atmosphere preferably contains $N_2$ or $NH_3$, at a partial pressure of at least about 2 atm. When the gas for the non-oxidizing atmosphere does not contain gases having an N ingredient such as $N_2$ or $NH_3$, $Si_3N_4$ may possibly be decomposed in the firing. The gas for the non-oxidizing atmosphere may contain rare gases such as argon and helium in addition to $N_2$ or $NH_3$. In this case, $N_2$ or $NH_3$ preferably has a partial pressure of at least 2 atm.

The gas for the non-oxidizing atmosphere may consist essentially of $N_2$, $NH_3$ or a mixture of $N_2$ and $NH_3$. In the case where the atmospheric gas comprises essentially $N_2$, it is preferred that the atmospheric gas in the firing is at a pressure of at least about 2 atm and at a temperature of at least about 1600° C. In the case where the atmospheric gas consists essentially of $NH_3$, the atmospheric gas is preferably at a pressure of at least about 3 atm and at a temperature of at least about 1600° C. in the firing. In the case where the atmospheric gas comprises essentially a mixture of $N_2$ and $NH_3$, the atmospheric gas is preferably at a pressure of at least about 2 atm and at a temperature of at least about 1600° C. in the firing.

According to this invention, the non-oxidizing atmospheric gas is preferably at a pressure of at least about 2 atm and, more preferably, at least about 5 atm. If the pressure of the non-oxidizing atmospheric gas in the firing is not higher than about 2 atm, and even if it is higher than 1 atm, the production rate of forming $\beta$-$Si_3N_4$ is reduced or lowered.

In the procss for producing $\beta$-$Si_3N_4$ according to this invention, $Si_3N_4$ having high chemical purity is fired in the non-oxidizing atmosphere under elevated pressure at a temperature of at least about 1600° C. If the atmosphere in the firing is not non-oxidizing, there is a possibility that at least a portion of the $Si_3N_4$ may be oxidized. If the firing is carried out at a pressure lower than the normal pressure (1 atm), for example, under a reduced pressure of 0.1 atm at 1700° C., $Si_3N_4$ may be decomposed into Si and $N_2$. Also, if the firing temperature is lower than about 1600° C., little production of $\beta$-$Si_3N_4$ occurs even under the elevated pressure.

In this invention, it is preferred to elevate the firing temperature to about 1700–1800° C. in order to enhance the forming or production rate of $\beta$-$Si_3N_4$. Also, in order to enhance the proportion or ratio of $\beta$-$Si_3N_4$ produced, it is preferred to increase or elevate the pressure to about 10 atm and increase or elevate the firing temperature to about 1700–1800° C.

In this invntion, the $Si_3N_4$ to be fired may be entirely amorphous $Si_3N_4$, entirely $\alpha$-$Si_3N_4$ or a mixture of amorphous and $\alpha$-$Si_3N_4$. Also, the ratio of $\beta$-$Si_3N_4$ in the $Si_3N_4$ article is preferably 50% or more. The term "high chemical purity", referring to the purity of $Si_3N_4$, means that the content or proportion of the elements, other than those constituting $Si_3N_4$, is not more than about 5% by weight.

This invention will be more clearly understood with reference to the following examples:

EXAMPLE 1

At first, using a reaction furnace 1 as shown in FIG. 1, an $\alpha$-$Si_3N_4$ layer 3 was formed on a graphite plate 2 by the CVD process under a reduced pressure. $SiCl_4$ and $NH_3$ were used as a reaction gas. $SiCl_4$ in a 10% mixture in a carrier gas of $H_2$ (i.e., $SiCl_4/H_2 = 1/10$ on a molecular basis) was inroduced at a flow rate of 1 l/min from a pipe 4, while $NH_3$ in a 10% mixture in a carrier gas $H_2$ (i.e., $NH_3/H_2 = 1/10$ on a molecular basis) was introduced at a flow rate of 1 l/min from a pipe 5. A pipe 6 was connected to a vacuum pump (not shown) for exhaustion, by which the pressure in a chamber 7 of the reaction furnace 1 was kept at a level of about 20 mmHg. In FIG. 1, a coil 8a for induction heating and a carbon heater 8 associated with the coil 8a are also shown. The graphite plate 2 was used as a substrate. The temperature of the graphite plate 2 in the chamber 7 was maintained at from 700° to 1300° C. by the heater 8. The graphite plate 2 was 100 mm × 100 mm × 10 mm in size and was fixedly placed on a supporting bed 10 so that the surface 9 having a 100 mm × 100 mm area was exposed upwardly. The $\alpha$-$Si_3N_4$ layer 3 was deposited in the form of a plate to a thickness of 3.2 mm on the surface 9 of the graphite plate 2 having a 10 mm × 100 mm area over a period of 40 hours.

Figure 2:
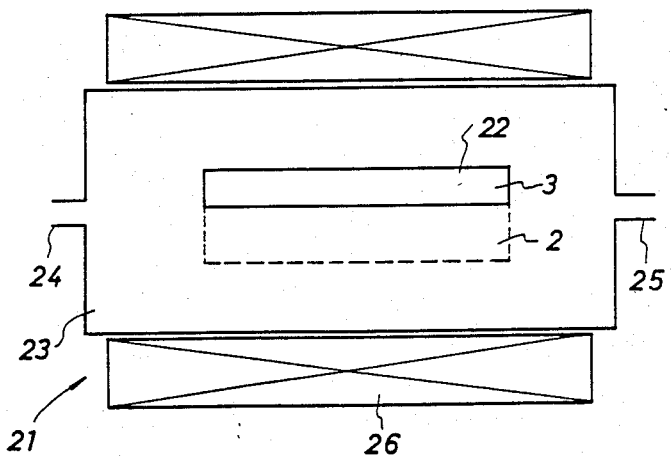
FIG. 2 is an a schematic view of a furnace for burning out a graphite plate on which amorphous or α-$Si_3N_4$ is deposited.

Then, using an oxidizing furnace 21 as shown in FIG. 2, the graphite plate 2 was burnt out to produce an $\alpha$-$Si_3N_4$ plate 22. Specifically, the graphite plate 2, on which the $\alpha$-$Si_3N_4$ layer 3 had been deposited by the CVD process by using the reaction furnace 1 as shown in FIG. 1, was placed in the chamber 23 of the oxidizing furnace 21, and dry air was introduced from an inlet 24 to the inside of the chamber 23 at a flow rate of 5 l/min and then exhausted from outlet 25. In the oxidizing treatment, the temperature in the chamber 23 was maintained from 600° to 800° C. by a heater 26. In order to burn out the graphite plate 2, oxygen gas may be used instead of dry air. In the case of using oxygen gas, the flow rate thereof may be lower than that of the dry air.

In order to remove the graphite plate 2, mechanical means such as cutting or grinding may also be used. Further, depending on the use of the $Si_3N_4$ product produced, the graphite plate 2 may be left. On the other hand, in the case where the substrate or base for forming the $Si_3N_4$ layer thereon by the CVD process is made of a material different from graphite or carbon, for example, silicon or quartz glass, etching means known in the field of the semiconductor processing art may be used for the removal of the substrate.

Figure 3:
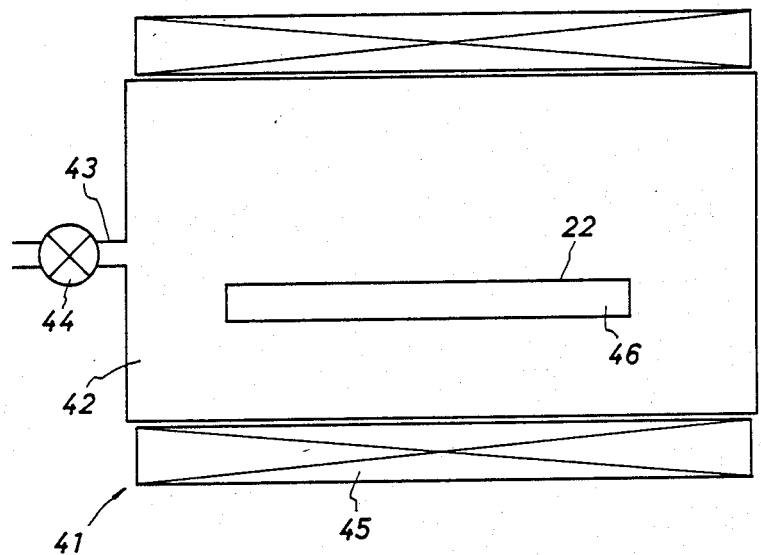
FIG. 3 is a schematic view of a heat treating furnace for producng $\beta$-$Si_3N_4$ from amorphous or α-$Si_3N_4$.

Then, the $\alpha$-$Si_3N_4$ plate 22 produced by burning out the graphite plate 2 in the oxidizing furnace 21 shown in FIG. 2 was treated in a heat treating furnace 41 under an elevated pressure as shown in FIG. 3. For treatment in the furnace 41, the $\alpha$-$Si_3N_4$ plate 22 was disposed in a chamber 42 of the heat treating furnace 41, and $N_2$ gas at 10 atm was introduced from a conduit 43 into the chamber 42. And then, the temperature inside the chamber 42 was elevated to 1750° C. by a heater 45 while closing a gas charge/discharge valve 44. Th epressure of the $N_2$ gas in the chamber 42 was 10 atm. After the heat treatment under the elevated pressure for 10 hours, 80% by weight of $\alpha$-$Si_3N_4$ constituting the initial or original $Si_3N_4$ plate 22 was changed or converted into $\beta$-$Si_3N_4$ and a $Si_3N_4$ plate 46 having a composition of 80% by weight of $\beta$-$Si_3N_4$ and 20% by weight of $\alpha$-$Si_3N_4$ was produced (hereinafter referred to as sample 1).

TEST 1 (CORROSION RESISTANCE TEST)

Then, the $Si_3N_4$ plate produced in accordance with Example 1 (80% $\beta$-$Si_3N_4$ and 20% $\alpha$-$Si_3N_4$; sample 1), $\alpha$-$Si_3N_4$ as it existed before the heat treatment under the elevated pressure as a Comparative Example (sample 2) and a quartz glass or silica glass $SiO_2$ for use in a crucible employed in a conventional silicon crystal pulling method (sample 3) as another Comparative Example were immersed in a molten silicon contained in a quartz glass crucible at a temperature of 1550° C. for two hours. The extent or the rate of the corrosion for each of the sample plates (each of a same size, 5 mm × 100 mm × 3 mm in size before the immersion) was measured. As a result, the corrosion rate for each of the samples is shown in Table 1.

TABLE 1

| Sample No. | Composition | Corrosion rate (/um/hr.) | Corrosion Resistance |
| --- | --- | --- | --- |
| 1 | 80% $\beta$-$Si_3N_4$ | 10 | good |
| 2 | $\alpha$-$Si_3N_4$ (CVD) | 150 | poor |
| 3 | $SiO_2$ | 180 | poor |

From Table 1, it can be seen that sample 1 of Example 1 comprising 80% by weight of $\beta$-$Si_3N_4$ and 20% by weight of $\alpha$-$Si_3N_4$ according to this invention has more excellent corrosion resistance to the molten silicon than that of sample 2 made of $\alpha$-$Si_3N_4$ produced by the CVD process or sample 3 made of conventional quartz glass.

TEST 2 (PURITY)

Impurity contents were examined for sample 1 produced in accordance with Example 1 and a sample 4 comprising $\beta$-$Si_3N_4$ produced by a known reaction sintering process and having higher purity than that of the sintered $Si_3N_4$ product which had generally been produced by using an ordinary sintering agent or aid. The results are shown in Table 2.

TABLE 2

| Sample No. | Composition | Kind of Impurity (ppm) | | | | | |
|---|---|---|---|---|---|---|---|
| | | Na | Ca | Fe | Al | Cr | Mn |
| 1 | 80% β-Si$_3$N$_4$ 20% α-Si$_3$N$_4$ | less than 10 | less than 10 | less than 10 | less than 10 | less than 10 | less than 10 |
| 4 | β-Si$_3$N$_4$ (reaction -sintering) | 40 | 1100 | 3900 | 2300 | 400 | 80 |

As is apparent from Table 2, the Si$_3$N$_4$ of sample 1 produced in accordance with this invention has a considerably lower impurity content than that of sample 4 obtained by the conventional reaction sintering. Furthermore, as for metal impurities other than those described in Table 2, sample 1 contained the impurities at much lower level than the sample 4.

Figure 4:
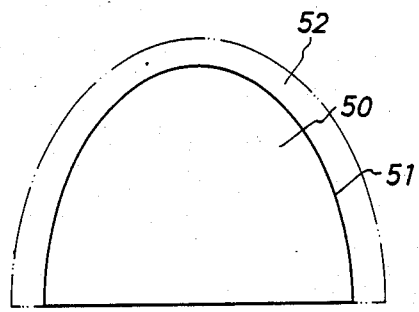
FIG. 4 is a side view of a graphite substrate for preparing a crucible comprised of $\beta$-$Si_3N_4$.

From the results of the tests 1 and 2, sample 1 produced in accordance with Example 1 is superior to α-Si$_3$N$_4$ and a quartz glass in terms of corrosion resistance to the molten silicon and also superior to the conventional reaction sintered β-Si$_3$N$_4$ in terms of the impurity content. For instance, sample 1 is suited as a material to prepare a crucible for containing or accommodating molten silicon therein for producing single crystal or polycrystalline silicon or amorphous silicon by the pulling-up method. In the case of preparing or forming the crucible, the graphite material used as the substrate may previously be shaped in the form or configuration, for example, shown by reference numeral 50 in FIG. 4. Then, amorphous or α-Si$_3$N$_3$ is deposited on the surface 51 of the graphite material 50 by the CVD process as shown by reference numeral 52. The deposited layer 52 substantially forms the shape of the crucible.

The β-Si$_3$N$_4$ or the Si$_3$N$_4$ product produced in accordance with this invention can be applied to various uses other than the crucible, such as turbine blades or the like.

EXAMPLE 2

First, amorphous Si$_3$N$_4$ was prepared by the CVD process according to the same procedures as in Example 1 except that the temperature during the CVD process was set at 1000° C. Then, the graphite plate was burnt out in the same manner as in Example 1. Subsequently, the heat treatment under elevated pressure was carried out in the same manner as in Example 1. The resulting Si$_3$N$_4$ comprised 75% by weight of β-Si$_3$N$_4$ and 25% by weight of α-Si$_3$N$_4$ (sample 5) as shown in Table 3.

Furthermore, the Si$_3$N$_4$ plates prepared by the CVD process according to the same procedures as in Example 1 were fired under various conditions of heat treatment under elevated pressure for 10 hours to produce samples 6–17 as shown in Table 3.

TABLE 3

| Sample No. | Condition for Heat Treatment Under Elevated Pressure | | | | Resultant Composition | |
|---|---|---|---|---|---|---|
| | Atmospheric gas | Pressure (atm) | Temperature (°C.) | Thickness (mm) | α (%) | β (%) |
| 5 | N$_2$ | 10 | 1750 | about 3 | 25 | 75 |
| 6 | N$_2$ | less than 2 | 1750 | about 3 | 85 | 15 |
| 7 | N$_2$ | 2 | 1750 | about 3 | 35 | 65 |
| 8 | N$_2$ | 2 | 1600 | about 3 | 47 | 53 |
| 9 | N$_2$ | 2 | less than 1600 | about 3 | 98 | 2 |
| 10 | NH$_3$ | less than 2 | 1750 | about 3 | 81 | 19 |
| 11 | NH$_3$ | 2 | 1750 | about 3 | 37 | 63 |
| 12 | NH$_3$ | 2 | less than 1600 | about 3 | 99 | 1 |
| 13 | NH$_3$ | 10 | 1750 | about 3 | 25 | 75 |
| 14 | N$_2$ and NH$_3$ | 2 | 1750 | about 3 | 35 | 65 |
| 15 | N$_2$ and NH$_3$ | 10 | 1750 | about 3 | 22 | 78 |
| 16 | N$_2$ and Ar | 2 | 1750 | about 3 | 42 | 58 |
| 17 | N$_2$ and Ar | 10 | 1750 | about 3 | 36 | 64 |

The results of the corrosion resistance test carried out in the same manner as in Test 1 of Example 1 for samples 5–17 are shown in Table 4. The results of the purity evaluation for each of the samples 5–17 were the same as those for sample 1 of Example 1.

As is apparent from Tables 3 and 4, as regards the relationship between the conditions for the heat treatment under elevated pressure and the production rate or proportion of β-Si$_3$N$_3$, the ratio or proportion of β-Si$_3$N$_4$ is increased as the processing pressure is raised and as the heating temperature is raised. However, if the treatment is carried out at a temperature higher than 1850° C., there is a possibility that Si$_3$N$_4$ may tend to be decomposed. Also, as regards the relationship between the ratio or proportion of β-Si$_3$N$_4$ and the corrosion resistance, the corrosion resistance is remarkably improved when the ratio of β-Si$_3$N$_4$ exceeds 50% by weight.

TABLE 4

| Sample No. | Composition (%) | | Corrosion Rate (/μm/hr.) | Corrosion Resistance |
|---|---|---|---|---|
| | α-Si$_3$N$_4$ | β-Si$_3$N$_4$ | | |
| 5 | 25 | 75 | 15 | good |
| 6 | 85 | 15 | 105 | poor |
| 7 | 35 | 65 | 17 | good |
| 8 | 47 | 53 | 33 | good |
| 9 | 98 | 2 | 110 | poor |
| 10 | 81 | 19 | 100 | poor |
| 11 | 47 | 63 | 19 | good |
| 12 | 99 | 1 | 120 | poor |
| 13 | 25 | 75 | 17 | good |
| 14 | 35 | 65 | 18 | good |
| 15 | 22 | 78 | 13 | good |
| 16 | 42 | 58 | 35 | good |
| 17 | 36 | 64 | 23 | good |

What is claimed is:

1. A process for producing a β-form Si$_3$N$_4$ article, comprising the steps of:
    depositing a Si$_3$N$_4$ starting material comprising less than about 0.5% by weight of impurities on a substrate by chemical vapor deposition;
    firing the Si$_3$N$_4$ deposit in a non-oxidizing atmosphere consisting essentially of one of N$_2$, NH$_3$ and mixtures thereof under an elevated pressure of at least about 2 atm at a temperature of at least about 1700° C. so as to obtain a Si$_3$N$_4$ article comprising at least about 60% by weight of β-form Si$_3$N$_4$; and removing the substrate after the deposition step.

2. A process according to claim 1, wherein said $Si_3N_4$ starting material comprises α-form $Si_3N_4$.

3. A process according to claim 1, wherein said $Si_3N_4$ starting material comprises amorphus $Si_3N_4$.

4. A process according to claim 1, wherein said non-oxidizing atmosphere comprises $N_2$ gas.

5. A process according to claim 1, wherein said non-oxidizing atmosphere comprises $NH_3$ gas.

6. A process according to claim 1, wherein said non-oxidizing atmosphere comprises a mixture of $N_2$ gas and $NH_3$ gas.

7. A process according to claim 1, wherein said elevated pressure in the firing is at least about 5 atm.

8. A process according to claim 1, wherein said temperature in the firing is less than about 1850° C.

9. A process according to claim 1, wherein said substrate comprises carbon.

10. A process according to claim 1, wherein said substrate comprises quartz glass.

11. A process according to claim 1, wherein said substrate comprises silicon.

12. A process according to claim 1, wherein said $Si_3N_4$ article comprises less than about 0.5% by weight of impurities.

13. A process according to claim 8, wherein the firing step is maintained at a pressure of about 10 atm.

14. A process according to claim 1, wherein said impurities comprise Na, Ca, Fe, Al, Cr and Mn.

15. A process according to claim 14, wherein said impurities comprise an amount equal to less than 10 ppm each.

16. A process according to claim 15, wherein said $Si_3N_4$ article comprises about 80% by weight of β-form $Si_3N_4$.

17. A process for producing a β-form $Si_3N_4$ article, comprising the steps of:

depositing a $Si_3N_4$ starting material comprising less than about 0.5% by weight of impurities on a substrate selected from the group consisting of carbon, quartz glass and silicon by chemical vapor deposition;

firing the $Si_3N_4$ deposit in a non-oxidizing atmosphere consisting essentially of one of $N_2$, $NH_3$ and mixtures thereof under an elevated pressure of at least about 2 atm at a temperature of at least about 1700° C. so as to obtain a $Si_3N_4$ article comprising at least about 60% by weight of β-form $Si_3N_4$; and removing the substrate after the deposition step.

18. A process according to claim 11, wherein the starting material comprises amorphous or a-form $Si_3N_4$ prepared by chemical vapor deposition.

* * * * *